United States Patent
Tsao et al.

(10) Patent No.: US 7,051,310 B2
(45) Date of Patent: *May 23, 2006

(54) TWO-STAGE CLOCK TREE SYNTHESIS WITH BUFFER DISTRIBUTION BALANCING

(75) Inventors: Chung-wen Tsao, San Jose, CA (US); Chin-Chi Teng, Sunnyvale, CA (US)

(73) Assignee: Cadence Design Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 385 days.

(21) Appl. No.: 10/434,919

(22) Filed: May 8, 2003

(65) Prior Publication Data
US 2004/0225984 A1 Nov. 11, 2004

(51) Int. Cl.
*G06F 17/50* (2006.01)
(52) U.S. Cl. ............................................. 716/10; 716/6
(58) Field of Classification Search .................. 716/10, 716/6
See application file for complete search history.

(56) References Cited

U.S. PATENT DOCUMENTS 6,367,060 B1* 4/2002 Cheng et al. .................. 716/10
6,609,228 B1* 8/2003 Bergeron et al. ............... 716/2
2003/0134836 A1* 7/2003 Chang et al. .................. 716/11

OTHER PUBLICATIONS

Mehta et al., Clustering and Load Balancing for Buffered Clock Tree Synthesis, Proceedings of the 1997 IEEE International Conference on Computer Design: VLSI in Computers and Processors, Oct. 12, 1997, pp. 217-223.*

* cited by examiner

*Primary Examiner*—A. M. Thompson
(74) *Attorney, Agent, or Firm*—Rosenberg, Klein & Lee (57) ABSTRACT

A clock tree synthesis (CTS) tool determines how to position a hierarchy of buffers for fanning out a clock signal to clocked devices ("sinks") within an integrated circuit (IC). The tool first clusterizes the sinks and places a lowest level fan-out buffer near each cluster. The tool then iteratively places progressively higher level buffers by clusterizing a last-placed buffer level and then placing a next higher level buffer near the centroid of each lower level buffer cluster, until the tool has placed buffers at a mid-level for which variation in path distances between that level and a next higher buffer level exceeds a predetermined limit. The CTS tool then places a top level buffer at the centroid of the mid-level buffers, divides the layout into partitions, each containing a similar number of mid-level buffers, and then places a second-highest level buffer in each partition. The CTS iteratively places each next lower buffer level by dividing each partition into progressively smaller partitions and placing progressively lower level buffers in each smaller partition until it places buffers at a level having sufficient number of buffers to drive the mid-level buffers.

34 Claims, 6 Drawing Sheets

TWO-STAGE CLOCK TREE SYNTHESIS WITH BUFFER DISTRIBUTION BALANCING

BACKGROUND OF THE INVENTION

1. Field of the Invention

The present invention relates in general to computer-aided design (CAD) tools for designing integrated circuits (ICs), and in particular to a method for designing a clock tree for an IC.

2. Description of Related Art

Figure 1:
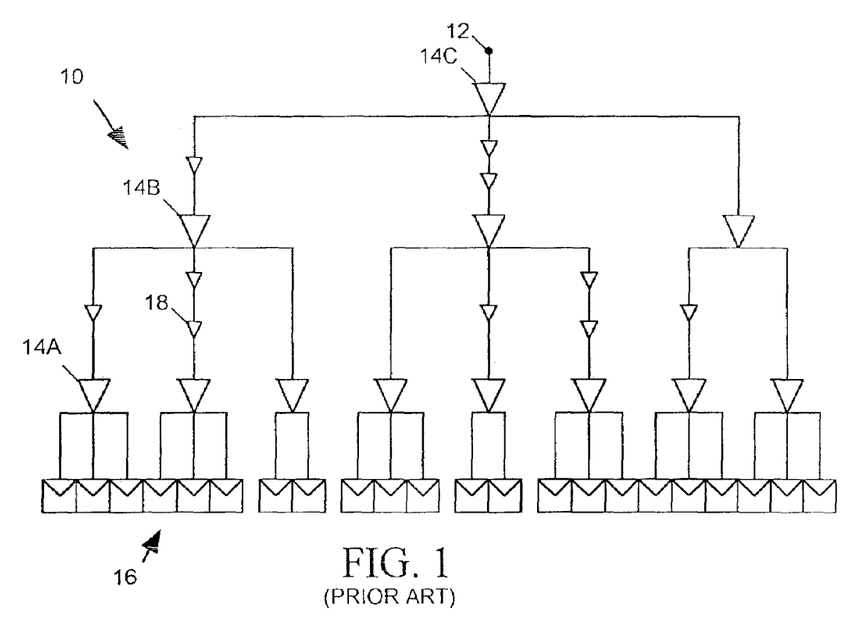
FIG. 1 is a block diagram of a prior art clock tree for delivering a clock signal to a set of sinks in an IC.

Referring to FIG. 1, a clock tree 10 distributes a clock signal from its root 12 to a set of sinks 16 within an IC through a branching network of fan-out buffers 14A–14C. In the example of FIG. 1, clock tree 10 delivers a clock signal to only a small number of sinks 16 and requires only three levels of buffers 14A–14C to fan the clock signal out to all sinks, but a clock tree for a large IC may deliver a clock signal to a much larger number of sinks and can require many more levels of fan-out buffers.

After establishing positions of all fan-out buffers 14A–14C and routing signal paths between them and sinks 16, a clock tree synthesis (CTS) tool estimates the path delays from clock tree root 12 to all sinks 16 and then inserts additional buffers 18 into various branches of clock tree 10 as needed to reduce variations in path delays to the sinks, thereby to balance clock tree 10.

Since the range over which buffers 18 can affect path delays is limited, to improve the likelihood that the CTS tool will be able to adequately balance the clock tree by inserting buffers 18, the CTS tool tries to position each fan-out buffer 14A–14C to minimize variation in signal path distances from each fan-out buffer to the next lower level fan-out buffers or sinks 16 it drives. Two approaches ("bottom-up" and "top-down") to determining where to position fan-out buffers 14 are commonly employed.

Bottom-Up Clock Tree Synthesis

Figure 2:
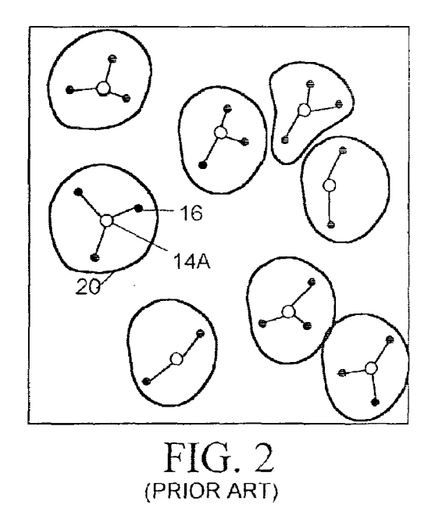
FIG. 2 is a plan view of a set of sinks in an IC layout illustrating how a prior art bottom up CTS tool might cluster the sinks of FIG. 1.

FIG. 2 is a plan view of an IC layout showing positions of a set of sinks 16 within the layout. In a conventional, "bottom-up" approach to clock tree synthesis, the clock tree is synthesized by first assigning nearby sinks 16 to a set of clusters 20 such that each cluster has no more than the number of sinks that can be driven by a single fan-out buffer and such that each cluster spans as little area as possible. The CTS tool provides a separate first-level fan-out buffer 14A to drive the sinks 16 assigned to each cluster 20, with the fan-out buffer being suitably positioned near the centroid of the cluster.

Figure 3:
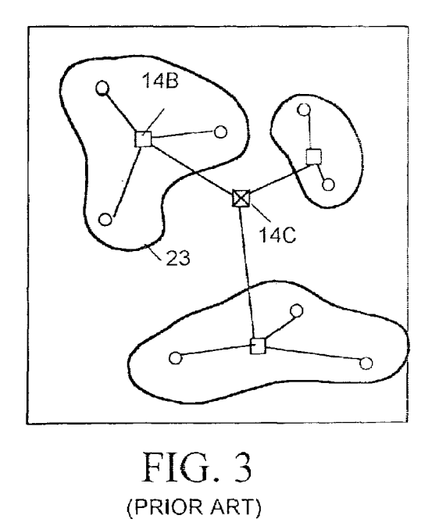
FIG. 3 is a plan view of a set of buffer in an IC illustrating how a prior art bottom up CTS tool might place and cluster buffers for driving the sinks of the clusters of FIG. 2.

As illustrated in FIG. 3, the CTS tool then assigns nearby first level buffers 14A to a set of clusters 22 and positions a second level buffer 14B near the centroid of each cluster 22 for driving the first level buffers 14A assigned to the cluster. The CTS tool then positions the top level buffer 14C near the centroid of all second level buffers 14B for driving the second level buffers.

Figure 4:
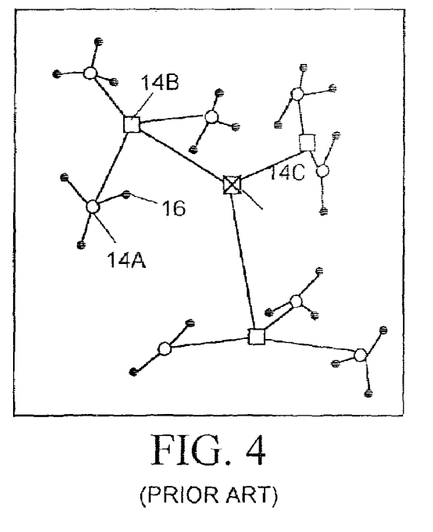
FIG. 4. is a plan view of an IC layout showing all of the buffers and sinks of FIGS. 2 and 3.

FIG. 4 illustrates the layout of the resulting clock tree. FIG. 4 shows that the clusterization process employed by the bottom-up synthesis approach can usually provide relatively uniform path distances between the first level buffers 14A and sinks 16. However at higher levels of the clock tree, the path distances between buffers become less uniform, making it more difficult for a CTS tool to subsequently balance the clock tree through buffer insertions.

Top-Down Synthesis

Figure 5:
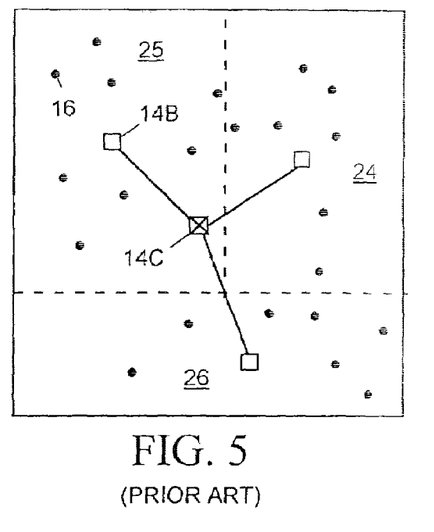
FIG. 5 is a plan view of a set of the sinks of the IC layout of FIG. 2 illustrating how a prior art top down up CTS tool might initially divide the layout into partitions.

Referring to FIG. 5, using a conventional, top-down partitioning approach to synthesizing a clock tree for delivering a clock signal to sinks 16, a CTS tool positions top level fan-out buffer 14C first, suitably near the centroid of all sinks 16. The CTS tool then divides the IC layout into a set of partitions 24–26, one for each second level buffer 14B, with each partition 24–26 being sized and shaped to contain approximately the same number of sinks 16. The CTS tool then positions a second level buffer 14B in each partition near the centroid of the sinks included in that partition.

Figure 6:
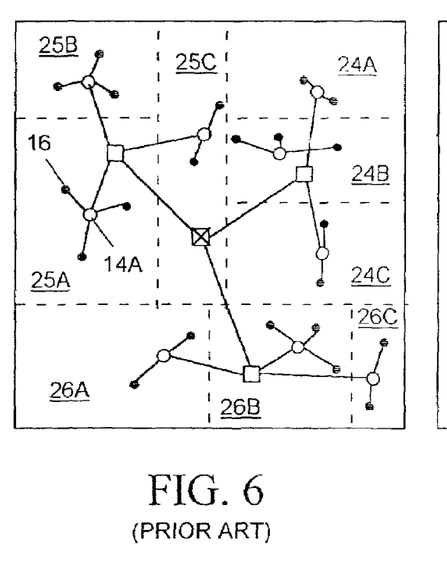
FIG. 6 is a plan view of a set of the sinks of the IC layout of FIG. 2 illustrating how a prior art top down up CTS tool might initially further divide the layout of FIG. 5 into smaller partitions and position buffers for driving sinks within each partition.

As illustrated in FIG. 6, the CTS tool next divides each partition 24–26 into a set of smaller partitions 24A–24C, 25A–25C and 26A–26C, and positions each first level buffer 14A near the centroid of the sinks 16 contained within a corresponding one of partitions 24A–24C, 25A–25C and 26A–26C. The process ends at this point because each partition contains no more than the maximum number of sinks 16 that can be driven by a buffer.

Figure 7:
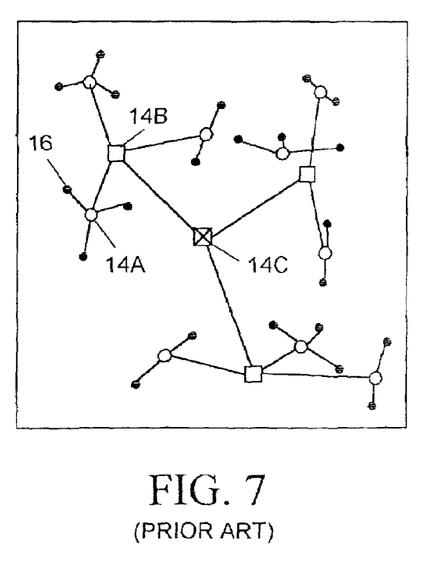
FIG. 7 is a plan view of an IC layout showing of all of the buffers and sinks of FIG. 6 with partition lines removed.

FIG. 7 illustrates the layout of the resulting clock tree and shows that the top-down synthesis approach can usually provide relatively uniform path distance between buffers at the highest levels of the clock tree. However at lower levels of the clock tree, the path distances become less uniform, thereby making it more difficult for a CTS tool to balance the clock tree.

BRIEF SUMMARY OF THE INVENTION

An integrated circuit (IC) layout specifies portions of various components of an IC. When the IC is to include a large number of registers, latches, flip-flops and/or other types of clocked devices ("sinks") that are to be clocked by the same clock, the IC must include a clock tree for delivering the clock signal from a single source to all of the sinks to be clocked by it. A clock tree includes a hierarchy of fan-out buffers (which may or may not invert the clock signal) for fanning the clock tree out from a single buffer at a top level of the hierarchy to a large number of buffers at the lowest level of the hierarchy that drive the clock inputs of the sinks. The invention relates to a method a clock tree synthesis tool may employ to determine how to position the fan-out buffer within the IC layout so as to limit variation in signal path distance from the clock signal source at the root of the clock tree, the input to the top level buffer, to the clock input of each sink.

A CTS tool employing the method in accordance with the invention selects positions for buffers forming the upper levels of the clock tree's buffer hierarchy using a top-down synthesis approach and selects positions for buffers forming lower levels of the clock tree using a bottom up approach.

The positions of buffers at the lower levels of the hierarchy can be selected first, using the bottom up approach starting with the buffers at the lowest levels and working upward. The bottom up approach stops at the highest buffer level for which variation in clock signal path distances between buffers of that level and the buffers of the next lower level remain within predetermined limits. The top down approach is then used to position buffers of the remaining higher levels of the hierarchy.

Alternatively, the positions of buffers at the higher levels of the hierarchy can be selected first using the top down approach starting with the single buffer at the top level of the hierarchy and working downward through the buffer level hierarchy. The top down approach then stops at the lowest buffer level for which variation in clock signal path distances between buffers of that level and the buffers of the next higher level remain within predetermined limits. The bottom up approach is then used to position the buffers forming the remaining higher levels of the hierarchy.

The combination "bottom-up/top-down" clock tree synthesis approach typically achieves better uniformity in clock signal path distances between the top level buffer and all sinks than can be obtained by a purely "bottom-up" or purely "top-down" approach.

It is accordingly an object of the invention to provide a method for synthesizing a balanceable clock.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to software stored on computer-readable media which when read and executed by a conventional computer, causes the computer to act as a clock tree synthesis (CTS) tool. Suitable computer-readable media for storing the software include, but are not limited to, compact disks, floppy disks, hard disks, and random access or read only memory. While the specification describes at least one exemplary embodiment of the invention considered to be a best mode of practicing the invention, the invention is not limited to the exemplary embodiment(s) described below or to the manner in which the exemplary embodiments operate.

The clock tree synthesis tool synthesizes a clock tree for an integrated circuit (IC) for delivering a clock signal to a large number of registers, latches, flip-flops and/or other types of clocked devices ("sinks") to be clocked by the same clock signal. The clock tree includes a hierarchy of buffers for fanning out the clock signal from a root node of the clock tree to clock inputs of all of the sinks. As described below, the CTS tool employs a combination "bottom-up/top-down" approach to selecting a position within the layout for each fan-out buffer to achieve better uniformity in clock path distances between the root node of the clock tree and all of the sinks than can usually be obtained by a purely "bottom-up" or purely "top-down" approach to buffer placement.

Figures 8, 9:
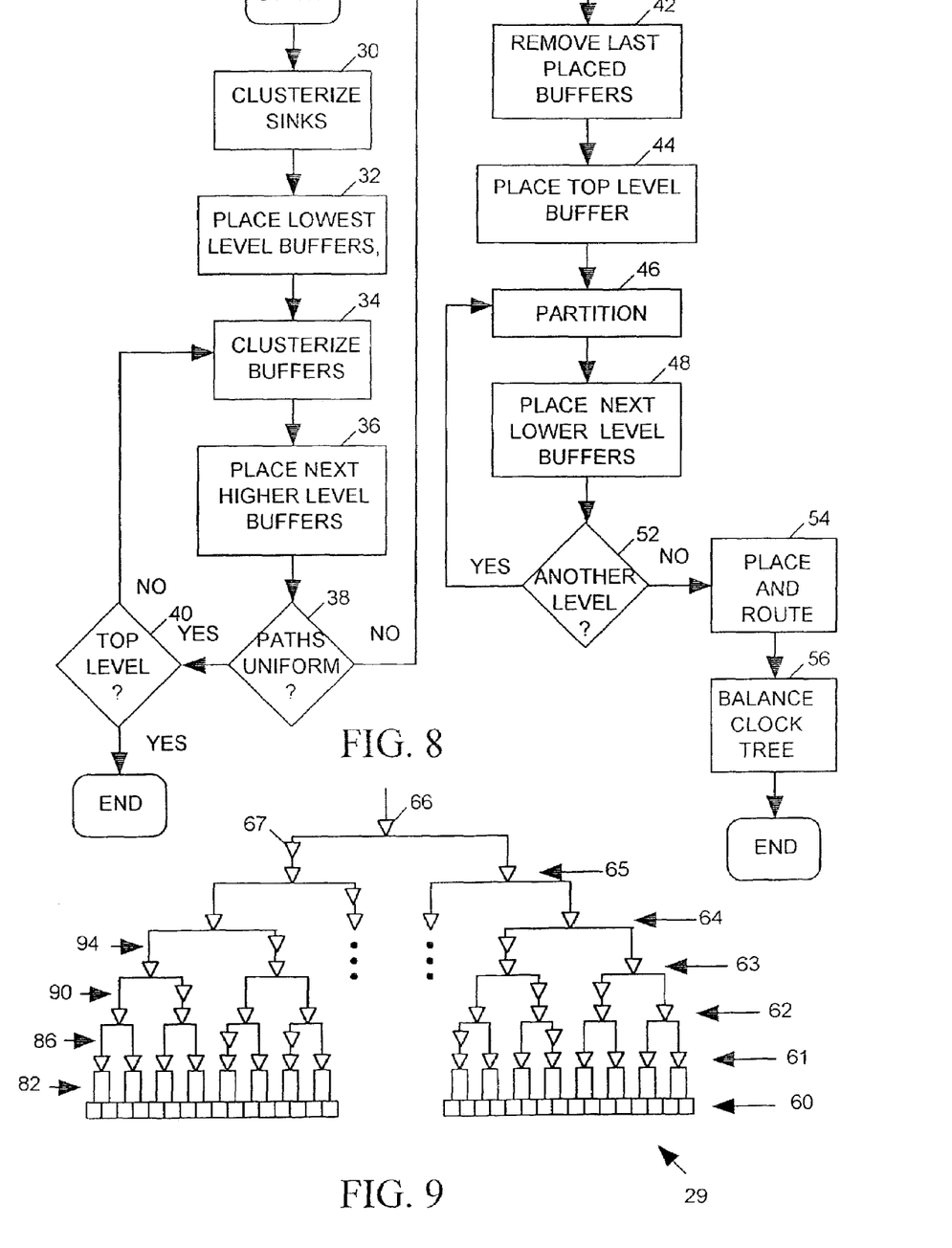
FIG. 8 is a flow chart depicting a method synthesizing a clock tree in accordance with the invention.
FIG. 9 is a block diagram of an example clock tree as might be synthesized by a clock tree synthesis tool in accordance with the invention.

FIG. 8 is a flow chart depicting a method in accordance with the invention that a CTS tool in accordance with the invention can employ to determine positions of buffers forming a clock tree. FIG. 9 illustrates an example clock tree 29 including fan-out buffers 61–65 to be positioned by the method of FIG. 8 and FIGS. 10–16 are simplified plan views of an IC layout illustrating various stages of the clock tree synthesis process of FIG. 8. The clock tree 29 to be synthesized includes a set of sinks 60 each of which is to receive edges of the same clock signal with as little variation in edge timing ("skew") as possible. For simplicity, clock tree 29 is shown as having five levels of fan-out buffers 61–65 for fanning a clock signal out to thirty-two sinks 60, although a typical large IC may require a clock tree having many more levels of fan-out buffers capable of fanning a clock signal out to thousands of sinks. A CTS tool can employ the method of FIG. 8 to select fan-out buffer positions for a clock tree of any size.

The CTS tool suitably synthesizes a clock tree after a placement and routing (P&R) tool has generated a layout for the IC indicating where cell instances, including all of the sinks, are to be positioned within an IC chip and indicating how all of the nets (conductors) that are to interconnect the cell instances are to be routed. However the layout does not at that point indicate positions of any of the buffers or nets forming a clock tree for distributing a clock signal to all of the sinks requiring it. The CTS tool analyzes the layout to determine an approximate position for each fan-out buffer 61–65 to be included in clock tree 29 and an approximate route for the nets that interconnect them to one another and to the sinks. The P&R tool then modifies the layout to show the position of each fan-out buffer 61–66 and to route nets that interconnect in the clock tree. Thereafter, the CTS tool uses conventional methods to analyze the layout to determine path delays though the net interconnecting fan-out buffers 61–65 and inserts additional buffers 67 into various nets as needed to balance the clock tree. The clock tree is considered "balanced" when the variation in path delay from its root node at the input of top level buffer 66 to each sink 60 is within a predetermined limit.

Figure 10:
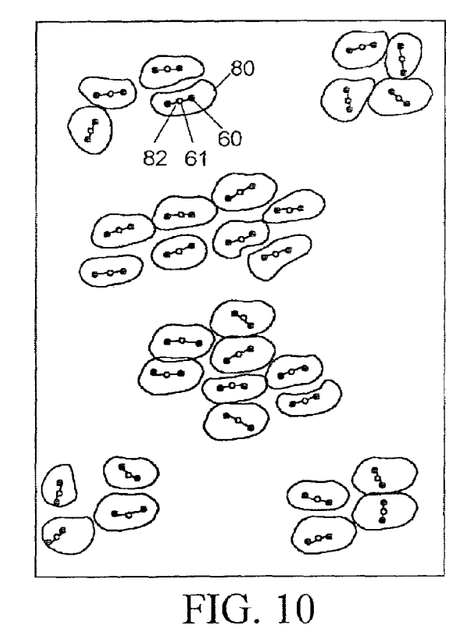
FIGS. 10–17 are plan views of an IC layout showing placement of sinks and buffers, and the signal paths there between at successive stages of a clock tree synthesis process in accordance with the invention.

Referring to FIG. 8, the CTS tool begins the process of selecting positions for each of fan-out buffers 61–66 using a bottom-up approach to place buffers forming lower levels of the clock tree buffer hierarchy. As illustrated in FIG. 10, the CTS tool initially "clusterizes" sinks 60 (step 30) by assigning nearby sinks to groups (clusters) 80 with the number of sinks assigned to each cluster being no greater than the number of sinks that can be driven by a single buffer. FIG. 10 shows the positions of the set of thirty-two sinks 60, with each sink 60 being represented in FIG. 10 by a small black circle. In the example of FIGS. 9–16 it is assumed for simplicity that any single fan-out buffer can drive a maximum of two sinks or two other buffers. The CTS tool therefore groups sinks 60 into clusters of not more than two sinks each, however in applications where a buffer can drive more than two sinks, the CTS may group sinks into larger clusters.

The next step of the CTS process is to select a position for a separate buffer 61 of the lowest level of the hierarchy near the centroid of each sink cluster (step 32). FIG. 10 shows a separate first level buffer 61 (represented by a small circle) positioned at the centroid of the sinks 60 of each cluster 80. The selected position of each first buffer 61 establishes an approximate routing for each signal path 82 that is to link that buffer 61 to a sink of the corresponding cluster. Note that while there is some variation in lengths of paths 82 from cluster-to-cluster, such variation is not large since the paths are short.

Figure 11:
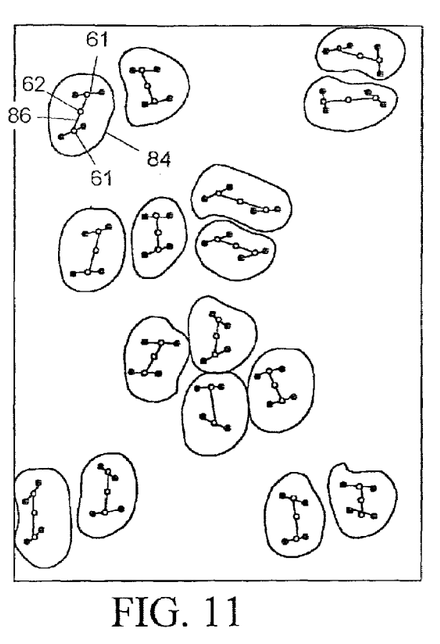

Referring to FIG. 11, the CTS tool next (step 34) clusterizes nearby first level buffers 61 to form clusters 84 wherein each buffer cluster 84 includes no more than the maximum number of first level buffers 61 (in this example two) that can be driven by a single second level buffer 62. The CTS tool then (step 36) selects a position for a separate second level buffer 62 near the centroid of each cluster 84 of first level buffers 61, thereby establishing approximate paths 86 for nets that are to link the output of each second level buffer 62 to an input of each first level buffer 61 of the corresponding cluster 84.

At this point (step 38), the CTS tool determines whether paths 86 are sufficiently uniform such that the variation in distances between second level buffers 62 and the first level buffers they are to drive is within a predetermined limit. Since at this level of the clock tree, paths 86 are still relatively short, the variation in path lengths is sufficiently small that the paths are considered "uniform" at step 38. If the CTS tool has not yet selected a position for the top level buffer 65 of the clock tree (step 40) then the tool returns to step 34 to clusterize the last-placed buffers, in this case buffers 62.

Figure 12:
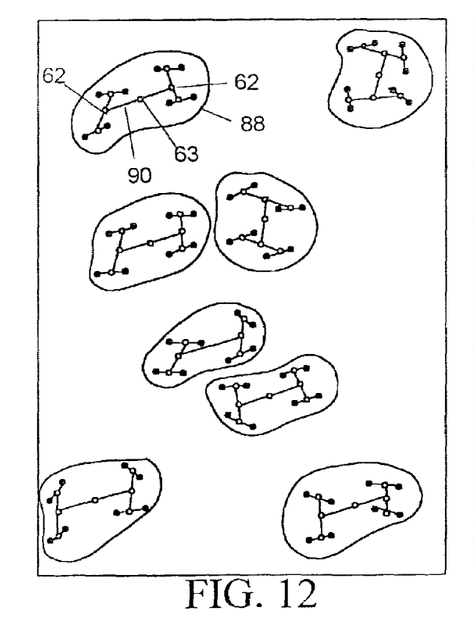

Referring to FIG. 12, the CTS tool next (step 34) clusterizes nearby second level buffers 62 to form clusters 88, wherein each cluster 88 includes (in this example) two second level buffers 62. The CTS tool then (step 36) selects a position for a third level buffer 63 near the centroid of the two second level buffers 62 of each cluster 88, thereby establishing approximate paths 90 for nets linking the output of each third level buffer 63 to an input of each second level buffer 62 of the corresponding cluster 88. The CTS tool again determines whether the paths 90 are sufficiently uniform from cluster-to-cluster (step 38). While paths 90 are longer than paths 86 of FIG. 11 and have more potential for variation, the CTS tool in this case determines at step 38 that the lengths of paths 90 is still sufficiently uniform.

Figure 13:
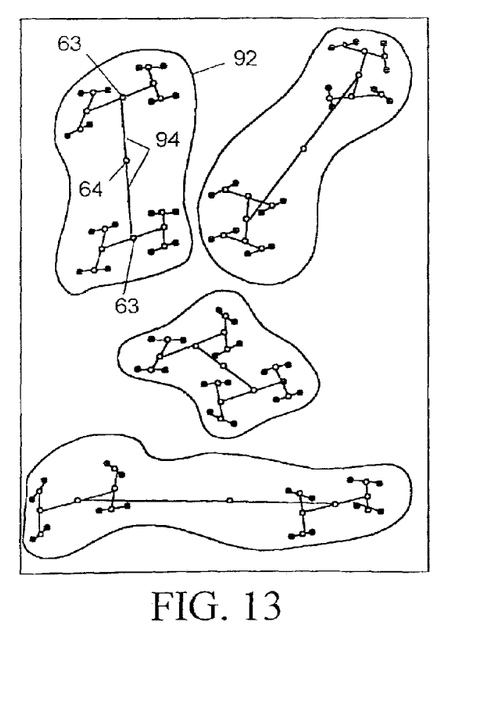

Having not yet reached the top level of the clock tree (step 40), the CTS tool repeats steps 34 and 36 to clusterize third level buffers 63 and to select a position for each fourth level buffer 64 near the centroid of each third level buffer cluster 92, as illustrated in FIG. 13. This establishes the approximate routes of signal paths 94 that will link third and four level buffers 63 and 64.

Paths 94 are relatively long, and in this example, the CTS tool determines at step 38 that the variation in lengths of paths 94 from one cluster 92 to another is too large for the paths to be considered of "uniform" length. Therefore the CTS tool considers the "bottom-up" approach to buffer placement to have gone beyond its limit and discards the selected positions for the last placed buffers (fourth level buffers 64) (step 42) so that the state of the clock tree design reverts to that shown in FIG. 12. As discussed below, the CTS tool will re-establish positions for fourth level buffers 64 later as a part of the top-down approach it employs to position buffers at the higher levels of the buffer hierarchy.

Figure 14:
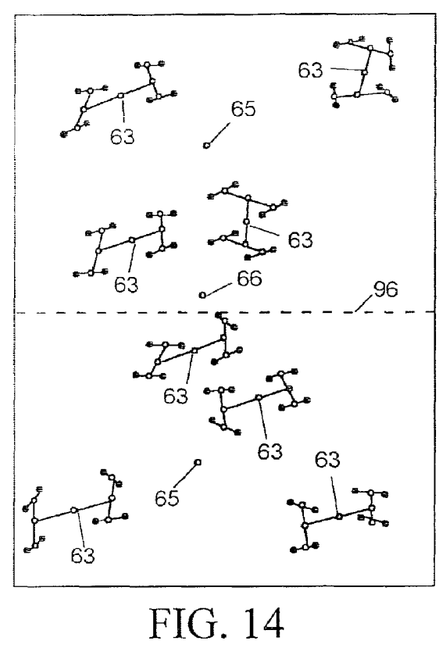

Thus at this point the CTS tool switches to the top-down approach by first placing a top level buffer 66 at the centroid of the highest level buffers (third level buffers 63) for which positions have been selected (step 44). The CTS tool then divides the layout into a set of partitions (in this example two), one for each buffer to be driven by top-level buffer 66 (step 46). The CTS tool sizes and positions each partition to include approximately the same number of third level buffers 63, the highest level of buffers for which positions were selected using the bottom-up approach.

FIG. 14 shows how the CTS tool positions top level buffer 66 near the centroid of third level buffers 63 at step 44 and includes a partition line 96 showing how the CTS tool partitions the layout at step 46 so that the same number of third level buffers 63 reside in each partition.

Figure 15:
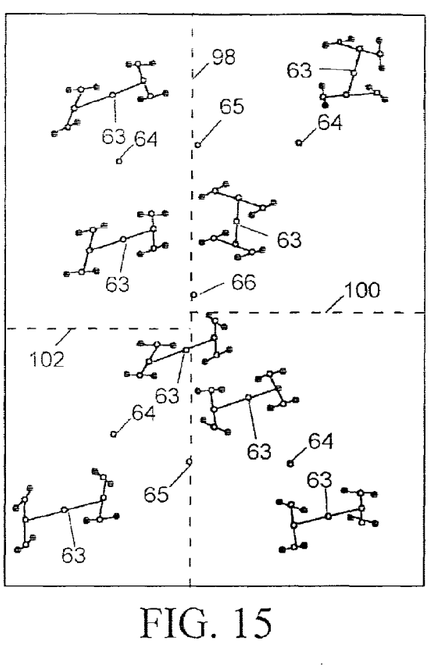

As shown in FIG. 15, the CTS tool then (step 48) selects a position for each buffer of a next lower level (fifth level buffers 65) within each partition near the centroid of the third level buffers 63 residing within that partition. Since there are too many third level buffers 63 in each partition to be driven by fifth level buffers 65, another level of buffers is needed (step 52). Therefore the CTS tool divides the current partitions along partition lines 100 and 102 (step 46) to produce a set of smaller partition, each containing approximately the same number of third level buffers 63. The CTS tool then positions a next lower level buffer 64 near the centroid of each smaller partition (step 48). Since the number of third level buffers 63 in each of the four smaller partitions is sufficiently small (two) to be driven by the single fourth-level buffer 64 with the partition, another level of buffers is not required (step 52).

Figure 16:
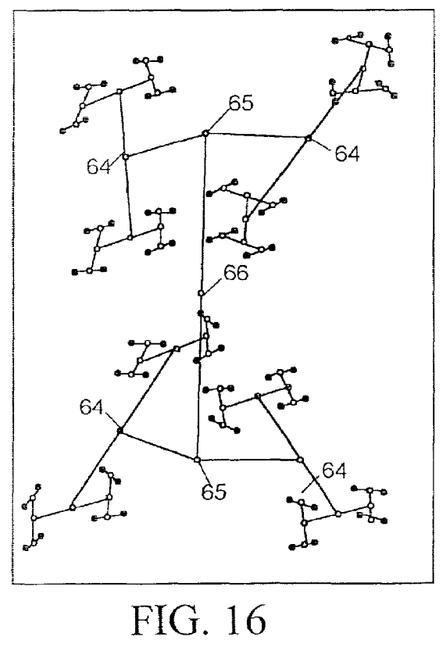

At this point the CTS tool has specified the approximate position of each buffer 61–65 needed to fan the clock signal out to sinks 60, and the positions of these fan-out buffers define the approximate routing of the signal paths interconnecting them as illustrated in FIG. 16. The CTS tool then (step 53) supplies its buffer placement plan to a conventional P&R tool which updates the IC layout to include buffers 60–65, with the P&R tool fixing the positions of buffers 61–65 as close as possible to the approximate positions specified by the CTS tool. The P&R tool also establishes the exact routing of the paths interconnecting buffers 61–65 to one another and to sinks 60.

Figure 17:
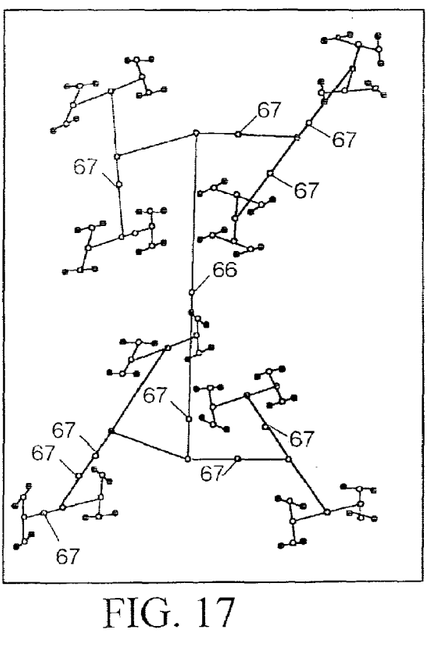

The CTS tool then processes the layout to balance the clock tree (step 54) by inserting additional buffers 67 into various branches of the clock tree, with buffers 67 being sized and positioned as illustrated in FIG. 17 to substantially equalize path delays from top level buffer 66 to each sink 60 so that clock skew is within acceptable limits. Methods for determining how to size and position buffers 67 to balance clock tree 29 are well-known to those of skill in the art.

Since a CTS tool can use buffer insertions to adjust path delays over only a relatively limited range, it can be difficult for a CTS tool to balance a clock tree in which the variation in total path distance from a clock tree's top level buffer to all sinks served by the clock tree is too large. Thus the combination bottom-up/top-down approach to buffer placement in accordance with the invention can provide for more uniformity in path distances than conventional bottom-up only, or top-down only approaches to buffer placement, and is more likely to provides a clock tree that can be successfully balanced by buffer insertions.

In the embodiment of the invention described above, the CTS tool initially lays out the lower levels of the clock tree on a bottom-up basis (steps 30–40 of FIG. 8), continuing to work upward through the buffer hierarchy until variation in signal path lengths between buffers at the last two levels become too large to be considered "uniform" (step 38). At that point the CTS tool switches to the top-down approach (steps 44–48) to lay out the upper levels of the tree. However in an alternative embodiment of the buffer positioning method in accordance with the invention, the tree can be laid out starting with the top-down approach, as illustrated in FIG. 18.

Figure 18:
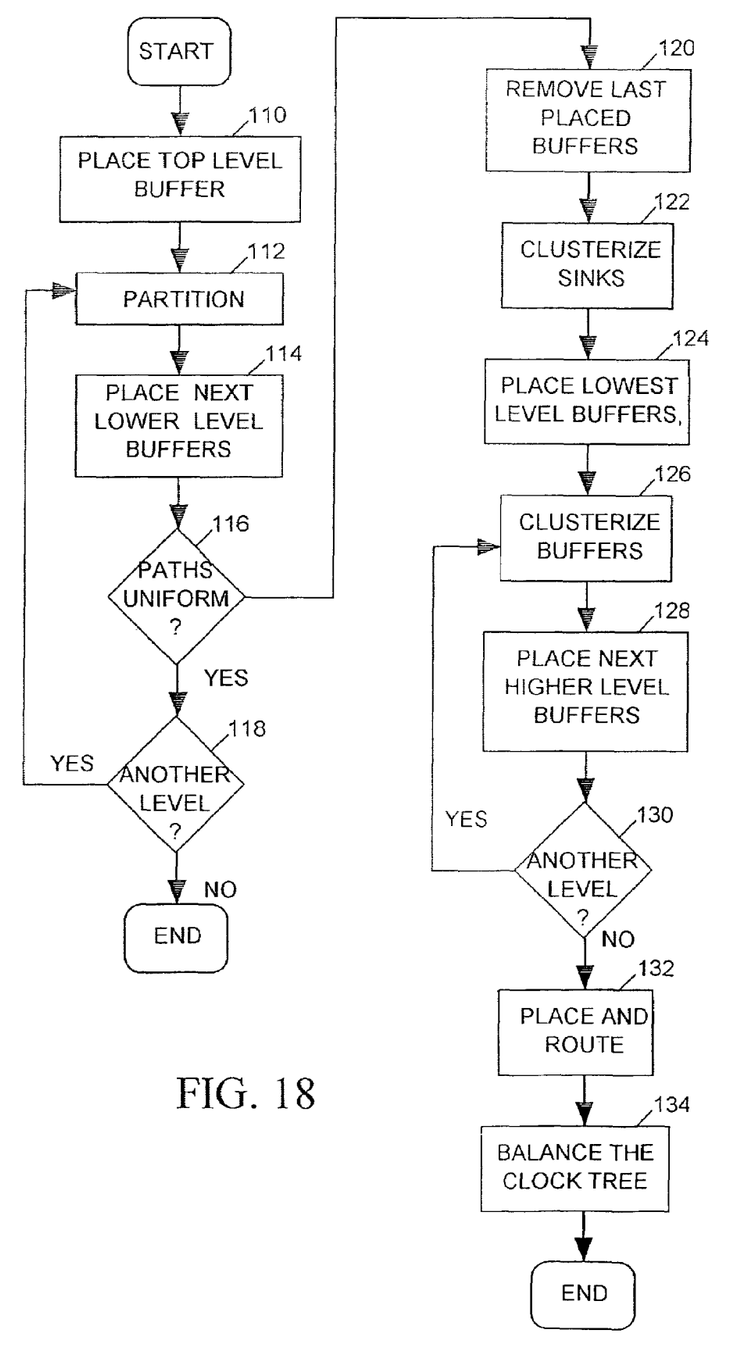
FIG. 18 is a flow chart depicting a method synthesizing a clock tree in accordance with an alternative embodiment of the invention.

Referring to FIG. 18, the tool initially selects a position for the top level buffer 66 near the centroid of sinks 60 (step 110) and then divides the layout into two (or more) partitions such that each partition includes approximately the same number of sinks (step 112). The CTS tool then selects a position for a next lower level buffer in a each partition, preferably near the centroid of the sinks within that partition (step 114). If the path lengths from the top level buffer to each of the next lower buffers are sufficiently uniform (step 116), and a next lower level of buffers is needed (step 118), the CTS tool returns to step 112 to divide each partition of the layout into smaller new partitions and to thereafter select a position for a next lower level buffer within each new partition near the centroid of sinks in that partition. The process continues to loop through steps 112-118 dividing the layout into progressively smaller partitions and selecting positions for progressively lower level buffers in those partitions until the CTS tool determines it has selected positions for the lowest level buffers of the hierarchy (step 118) or the CTS tool determines that the paths between the last two buffer levels placed are not sufficiently uniform (step 116).

In the latter case the tool de-selects the positions of the last placed buffers (step 120) and begins the bottom-up placement process at step 122 by clusterizing the sinks within each partition (step 122). The tool then selects a position for a separate lowest level buffer suitably near the centroid of each cluster (step 124), clusterizes those buffers (step 126), and then places a next higher level buffer at or near the centroid of each buffer clusters (step 128). When a next higher buffer level is needed (step 130), the tool returns to step 126 to clusterize the last placed buffer level and then selects positions for buffers of the next higher level of the hierarchy near the centroid of each new buffer cluster (step 128). The tool continues to loop through steps 126–130 selecting positions of progressively higher level buffers until it ends the placement process at step 130 upon determining that the next higher level of buffers has already been placed during the top-down phase of the process. After a placement and routing tool fixes the positions of the buffers and routes the nets interconnecting them (step 132) the CTS tool balance the clock tree in a conventional manner through buffer insertions (step 134).

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:

a. identifying clusters of the sinks;
 b. selecting a position for each buffer at the lowest level of the hierarchy that is proximate to a separate one of the identified clusters of the sinks;
 c. selecting a position for the top level buffer;
 d. selecting a position for each buffer of each of the lower intermediate levels, in ascending order according to where the lower intermediate levels appear in the hierarchy starting with a lowest of the lower intermediate levels and ending with a highest of the lower intermediate levels; and
 e. selecting a position for each buffer of each of the higher intermediate levels, in descending order according to where the higher intermediate levels appear in the hierarchy starting with a highest of the higher intermediate levels and ending with a lowest of the higher intermediate levels;
 whereby the buffer positions for intermediate levels of the clock tree are selected responsive to a combination of bottom up and top down approaches.

2. The method in accordance with claim 1 wherein the position of the top level buffer is selected at step c as a function of positions of the sinks.

3. The method in accordance with claim 2 wherein step c comprises the substeps of:

c1. determining a centroid of the sinks; and
 c2. selecting a position for the top level buffer that is proximate to the determined centroid of the sinks.

4. The method in accordance with claim 3 wherein the recited steps and respective substeps thereof are implemented in software stored on computer-readable media to be read and executed by a computer.

5. The method in accordance with claim 2 wherein the recited steps are implemented in software stored on computer-readable media to be read and executed by a computer.

6. The method in accordance with claim 1 wherein the position of the top level buffer is selected at step c as a function of positions of the lowest level buffers selected at step b.

7. The method in accordance with claim 6 wherein step c comprises the substeps of:

c1. determining a centroid of positions selected at step b of the buffers of the lowest level of the hierarchy, and
 c2. selecting a position for the top level buffer that is proximate to the centroid determined at substep c1.

8. The method in accordance with claim 7 wherein the recited steps and respective substeps thereof are implemented in software stored on computer-readable media to be read and executed by a computer.

9. The method in accordance with claim 6 wherein the recited steps are implemented in software stored on computer-readable media to be read and executed by a computer.

10. The method in accordance with claim 1 wherein the position selected for the top level buffer at step c is a function of positions selected at step d of buffers of the highest of the higher intermediate levels.

11. The method in accordance with claim 10 wherein the recited steps are implemented in software stored on computer-readable media to be read and executed by a computer.

12. The method in accordance with claim 1 wherein the recited steps are implemented in software stored on computer-readable media to be read and executed by a computer.

13. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:
 a. identifying clusters of the sinks;
 b. selecting a position for each buffer at the lowest level of the hierarchy that is proximate to a separate one of the identified clusters of the sinks;
 c. selecting a position for the top level buffer;
 d. selecting a position for each buffer of each of the lower intermediate levels, in an order in which the lower intermediate levels appear in the hierarchy starting with a lowest of the lower intermediate levels and ending with a highest of the lower intermediate levels; and
 e. selecting a position for each buffer of each of the higher intermediate levels, in an order in which the higher intermediate levels appear in the hierarchy starting with a highest of the higher intermediate levels and ending with a lowest of the higher intermediate levels;
 wherein the position selected for the top level buffer at step c is a function of positions selected at step d of buffers of the highest of the higher intermediate levels;
 wherein step c comprises the substeps of:
  c1. determining a centroid of positions selected at step b of the buffers of the highest of the lower intermediate levels of the hierarchy, and
  c2. selecting a position for the top level buffer that is proximate to the centroid determined at substep c1.

14. The method in accordance with claim 13 wherein the recited steps and respective substeps thereof are implemented in software stored on computer-readable media to be read and executed by a computer.

15. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:
 a. identifying clusters of the sinks;
 b. selecting a position for each buffer at the lowest level of the hierarchy that is proximate to a separate one of the identified clusters of the sinks;
 c. selecting a position for the top level buffer;
 d. selecting a position for each buffer of each of the lower intermediate levels, in an order in which the lower intermediate levels appear in the hierarchy starting with a lowest of the lower intermediate levels and ending with a highest of the lower intermediate levels; and
 e. selecting a position for each buffer of each of the higher intermediate levels, in an order in which the higher intermediate levels appear in the hierarchy starting with a highest of the higher intermediate levels and ending with a lowest of the higher intermediate levels;
 wherein the position of each buffer of each particular one of the lower intermediate levels is selected at step d as a function of selected positions of buffers at a level of the hierarchy immediately below that of the particular one of the lower intermediate levels.

16. The method in accordance with claim 15 wherein the position of each buffer of each particular one of the lower intermediate levels is selected at step d as a function of selected positions of buffers at the level of the hierarchy immediately below that of the particular one of the lower intermediate levels.

17. The method in accordance with claim 16 wherein the position of each buffer of each particular one of the lower intermediate levels is selected at step d as a centroid of selected positions of a separate cluster of buffers at the level of the hierarchy immediately below that of the particular one of the lower intermediate levels.

18. The method in accordance with claim 17 wherein the recited steps are implemented in software stored on computer-readable media to be read and executed by a computer.

19. The method in accordance with claim 16 wherein the recited steps are implemented in software stored on computer-readable media to be read and executed by a computer.

20. The method in accordance with claim 15 wherein the recited steps are implemented in software stored on computer-readable media to be read and executed by a computer.

21. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:
 a. identifying clusters of the sinks;
 b. selecting a position for each buffer at the lowest level of the hierarchy that is proximate to a separate one of the identified clusters of the sinks;
 c. selecting a position for the top level buffer;
 d. selecting a position for each buffer of each of the lower intermediate levels, in an order in which the lower intermediate levels appear in the hierarchy starting with a lowest of the lower intermediate levels and ending with a highest of the lower intermediate levels; and e. selecting a position for each buffer of each of the higher intermediate levels, in an order in which the higher intermediate levels appear in the hierarchy starting with a highest of the higher intermediate levels and ending with a lowest of the higher intermediate levels;

wherein step e comprises the substeps of:
   e1. partitioning the IC layout into a plurality of partitions;
   e2. selecting a position for each buffer of the highest of the higher intermediate levels within a separate corresponding one of the partitions;
   e3. partitioning each partition into a plurality of smaller partitions;
   e4. selecting a position for each buffer of a next highest of the higher intermediate levels within a separate, corresponding one of the smaller partitions; and
   e5. iteratively repeating steps e3 and 34 until a position has been selected for every buffer of every one of the higher intermediate levels.

22. The method in accordance with claim 21,
wherein at step e1 each of the plurality of partitions is sized and positioned within the layout such that each partition contains a substantially similar number of the sinks, and
wherein at each iteration of step e3, the smaller partitions are sized and positioned within the layout such that each partition contains a substantially similar number of sinks.

23. The method in accordance with claim 22,
wherein the position selected at step e2 for each buffer is proximate to a centroid of positions of the sinks within that buffer's corresponding partition, and
wherein the position selected at each iteration of step e4 for each buffer is proximate to a centroid of positions of the sinks within that buffer's corresponding smaller partition.

24. The method in accordance with claim 23 wherein the recited steps are implemented in software stored on computer-readable media to be read and executed by a computer.

25. The method in accordance with claim 22 wherein the recited steps are implemented in software stored on computer-readable media to be read and executed by a computer.

26. The method in accordance with claim 21,
wherein at step e1 each of the plurality of partitions are sized and positioned within the layout such that each partition contains a substantially similar number of the buffers of the highest of the lower intermediate levels, and
wherein at each iteration of step e3, the smaller partitions are sized and positioned within the layout such that each partition contains a substantially similar number of buffers of the highest of the lower intermediate levels.

27. The method in accordance with claim 26,
wherein the position selected at step e2 for each buffer of the highest of the higher intermediate levels is proximate to a centroid of selected positions of the buffer of the highest of the first intermediate level within the buffer's corresponding partition, and
wherein the position selected at step e4 for each buffer of a higher intermediate level is proximate to a centroid of selected positions of the buffers of the highest of the lower intermediate levels within the buffer's corresponding smaller partition.

28. The method in accordance with claim 27 wherein the recited steps are implemented in software stored on computer-readable media to be read and executed by a computer.

29. The method in accordance with claim 26 wherein the recited steps are implemented in software stored on computer-readable media to be read and executed by a computer.

30. The method in accordance with claim 21 wherein the recited steps and respective substeps thereof are implemented in software stored on computer-readable media to be read and executed by a computer.

31. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:
   a. identifying clusters of the sinks;
   b. selecting a position for each buffer at the lowest level of the hierarchy that is proximate to a separate one of the identified clusters of the sinks;
   c. selecting a position for the top level buffer;
   d. selecting a position for each buffer of each of the lower intermediate levels, in an order in which the lower intermediate levels appear in the hierarchy starting with a lowest of the lower intermediate levels and ending with a highest of the lower intermediate levels; and
   e. selecting a position for each buffer of each of the higher intermediate levels, in an order in which the higher intermediate levels appear in the hierarchy starting with a highest of the higher intermediate levels and ending with a lowest of the higher intermediate levels;
wherein step d is carried out prior to step e, and
wherein a level of the hierarchy that is the highest of the lower intermediate levels is selected at step d to be a highest level of the hierarchy for which variation in distance between buffers at that level of the hierarchy and buffers at a next lower level of the hierarchy to which they are to transmit the clock signal is within a predetermined limit.

32. The method in accordance with claim 31 wherein the recited steps are implemented in software stored on computer-readable media to be read and executed by a computer.

33. For an integrated circuit (IC) layout identifying positions within an IC of a plurality of devices (sinks) to be clocked by a clock signal, a clock tree synthesis method for processing the layout to select positions within the IC of buffers forming levels of a multiple-level hierarchy of interconnected buffers for transmitting the clock signal to the sinks, wherein buffers at a lowest level of the hierarchy transmit the clock signal to the sinks, wherein each buffer at any other level of the hierarchy transmits the clock signal to buffers at a next lower level of the hierarchy, wherein the clock tree comprises a plurality of lower intermediate levels of buffers above the lowest level, a plurality of higher intermediate levels of buffers above the lower intermediate levels, and a top level buffer above the higher intermediate levels, the method comprising the steps of:
   a. identifying clusters of the sinks;
   b. selecting a position for each buffer at the lowest level of the hierarchy that is proximate to a separate one of the identified clusters of the sinks;

c. selecting a position for the top level buffer;
d. selecting a position for each buffer of each of the lower intermediate levels, in an order in which the lower intermediate levels appear in the hierarchy starting with a lowest of the lower intermediate levels and ending with a highest of the lower intermediate levels; and
e. selecting a position for each buffer of each of the higher intermediate levels, in an order in which the higher intermediate levels appear in the hierarchy starting with a highest of the higher intermediate levels and ending with a lowest of the higher intermediate levels;

wherein step e is carried out prior to step d, and wherein a level of the hierarchy that is the lowest of the higher intermediate levels is selected at step e to be a lowest level of the hierarchy for which variation in distance between buffers at that level of the hierarchy and buffers at a next higher level of the hierarchy from which they are to receive the clock signal is within a predetermined limit.

34. The method in accordance with claim 33 wherein the recited steps are implemented in software stored on computer-readable media to be read and executed by a computer.

* * * * *